(12) United States Patent
Nakano et al.

(10) Patent No.: US 6,544,663 B1
(45) Date of Patent: Apr. 8, 2003

(54) ELECTRODEPOSITED COPPER FOIL

(75) Inventors: Osamu Nakano, Ageo (JP); Takashi Kataoka, Ageo (JP); Sakiko Taenaka, Ageo (JP); Naohito Uchida, Ageo (JP); Noriko Hanzawa, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 09/914,550

(22) PCT Filed: Nov. 27, 2000

(86) PCT No.: PCT/JP00/08330

§ 371 (c)(1),
(2), (4) Date: Aug. 28, 2001

(87) PCT Pub. No.: WO01/48272

PCT Pub. Date: Jul. 5, 2001

(30) Foreign Application Priority Data

Dec. 28, 1999 (JP) .............................. 11-372563

(51) Int. Cl.[7] .............................. C25D 7/04; C25D 1/00; C25D 1/04; C23F 3/00; B32B 9/04
(52) U.S. Cl. ....................... 428/606; 428/687; 428/409; 428/411.1; 428/458; 428/457; 428/901; 205/67; 205/77; 205/138; 205/143; 205/221; 205/223; 216/78
(58) Field of Search ................... 428/606, 687, 428/409, 411.1, 458, 901, 457; 205/67, 77, 138, 143, 221, 223; 216/78

(56) References Cited

FOREIGN PATENT DOCUMENTS

| JP | 63-310989 A | * | 12/1988 |
|----|-------------|---|---------|
| JP | 63-310990 A | * | 12/1988 |
| JP | 4-88185 A | * | 3/1992 |
| JP | 06-300714 A | * | 10/1994 |
| JP | 08-225905 A | * | 9/1996 |
| JP | 10-036991 A | * | 2/1998 |
| JP | 10-168596 A | * | 6/1998 |
| JP | 10-330983 A | * | 12/1998 |
| JP | 2000-045091 A | * | 2/2000 |
| JP | 2000-256765 A | * | 9/2000 |
| JP | 2001-11685 A | * | 1/2001 |
| WO | WO 90/05162 A1 | * | 5/1990 |
| WO | WO 91/19024 A1 | * | 12/1991 |

OTHER PUBLICATIONS

* References N–T were cited on the International Search Report.*
* References N–S were cited on the International Search Report.*
JP, 2001-11685, A (Mitsui Mining & Smelting Co., Ltd.) Jan., 16, 2001.
JP, 2000-45091, A (Nippon Steel Corporation), Feb., 15, 2000.
JP 2000256765A2, (Nippon Mining & Metals Co Ltd) Sep., 19, 2000.
JP 10168596A2, (Fukuda Metal Foil & Powder Co Ltd), Jun., 23, 1998.

(List continued on next page.)

Primary Examiner—Edna Wong
(74) Attorney, Agent, or Firm—Jenkens & Gilchrist

(57) ABSTRACT

An object of the present invention is to provide a copper foil having excellent adhesion to an etching resist layer, without performing physical polishing such as buffing in pretreatment of an etching process to form a circuit from the copper foil. To attain the object, in electroforming, a titanium material having a grain size number of 6.0 or more is employed as a copper deposition surface of the rotating drum cathode, and glue and/or gelatin is added in an amount of 0.2–20 mg/l to a copper sulfate solution, thereby producing a drum foil. An electrodeposited copper foil obtained from the drum foil, wherein 20% or more of the crystals present in a shiny side surface of the electrodeposited copper foil have a twin-crystal structure, is used for producing copper-clad laminates.

9 Claims, 10 Drawing Sheets

OTHER PUBLICATIONS

JP, 63–310990, A (Nippon Denkai K.K.), Dec., 19, 1998.
JP, 63–310898, A (Nippon Denkai K.K.), Dec., 19, 1988.
JP, 10–330983, A (Fukuda Metal Foil & Powder Co., Ltd.) Dec., 15, 1998.
JP 10–36991, A (Japan Energy Corp.), Feb., 10, 1998.
JP 6300714A2, (Japan Energy Corp.), Oct., 28, 1998.
JP 8225905A2, (Naikai AAKIT:KK), Sep., 3, 1996.
W0, 9104358A1, (Gould, Inc), Apr., 4, 1991.
WO, 91/19024, A1 (Gould, Inc), Dec., 12, 1991.
JP 4501887T2, (Gould, Inc), Apr., 2, 1992.
JP 4088185A2, (Nippon Denkai KK), Mar., 23 1992.

* cited by examiner

FIG. 3
The number of crystal grains identified in a unit domain: 23
Grain size number 5.5
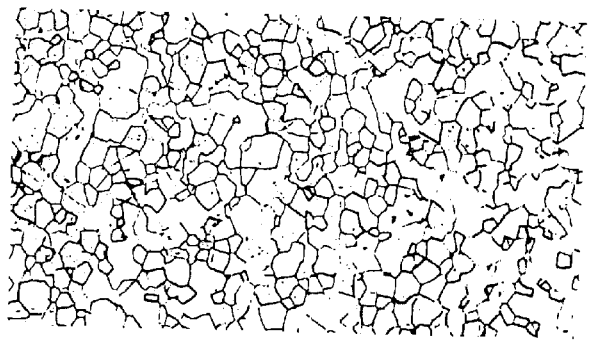
The number of crystal grains identified in a unit domain: 33
Grain size number 6.0
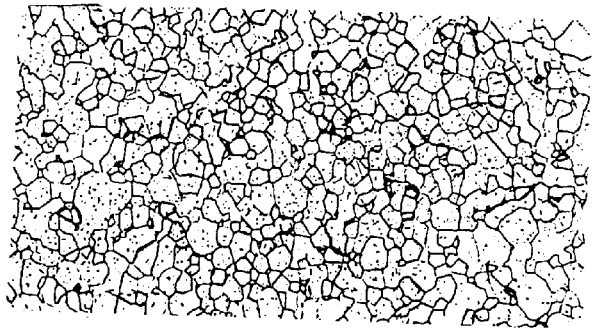
The number of crystal grains identified in a unit domain: 69
Grain size number 7.1
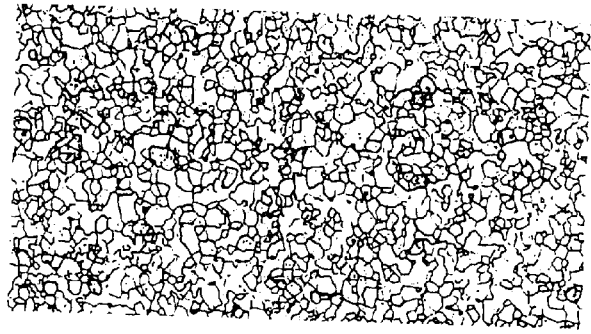
The number of crystal grains identified in a unit domain: 163
Grain size number 8.3
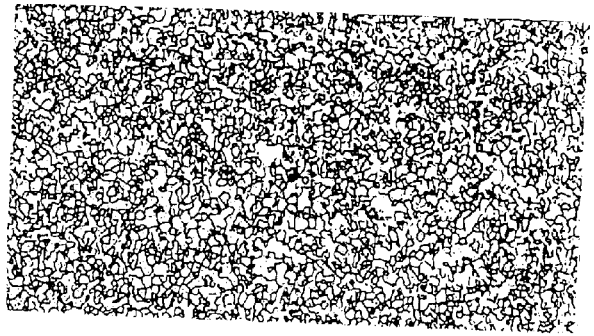

FIG. 4
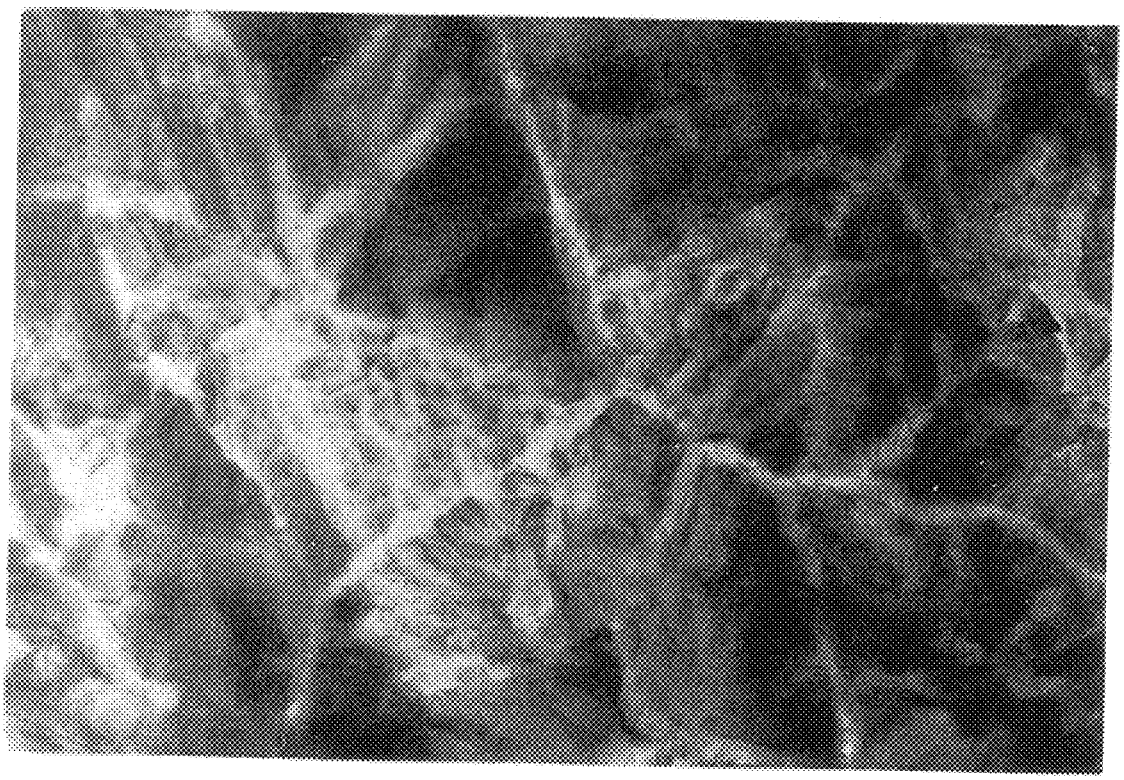
Observed TEM image (×3000)
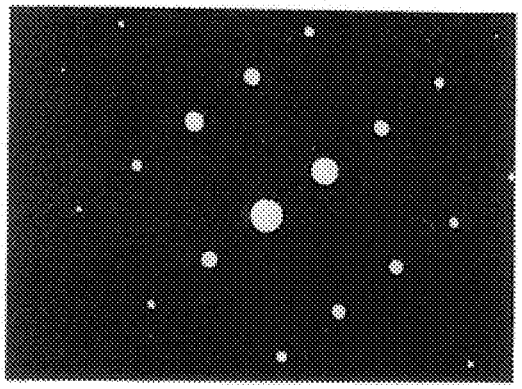
Electron-beam diffraction pattern FIG. 5
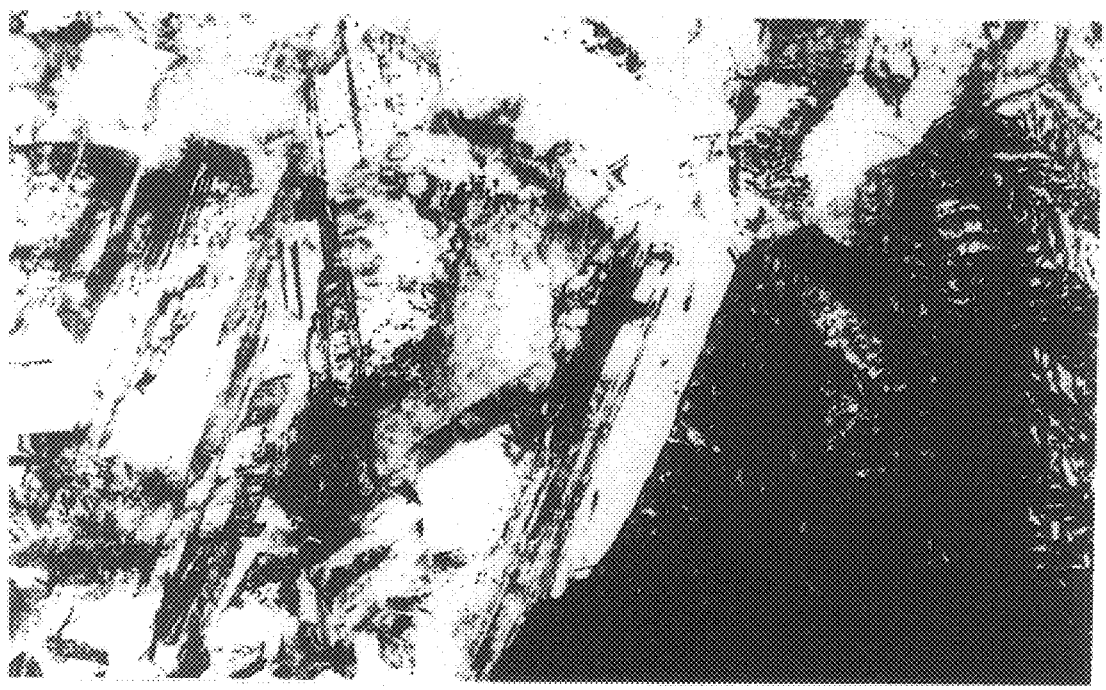
Electron-beam diffraction pattern
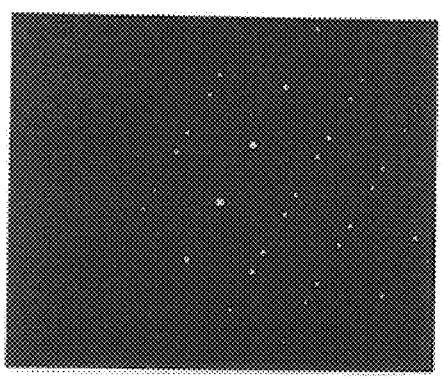
Observed TEM image (×11000)

FIG. 6
Twin-crystal structure
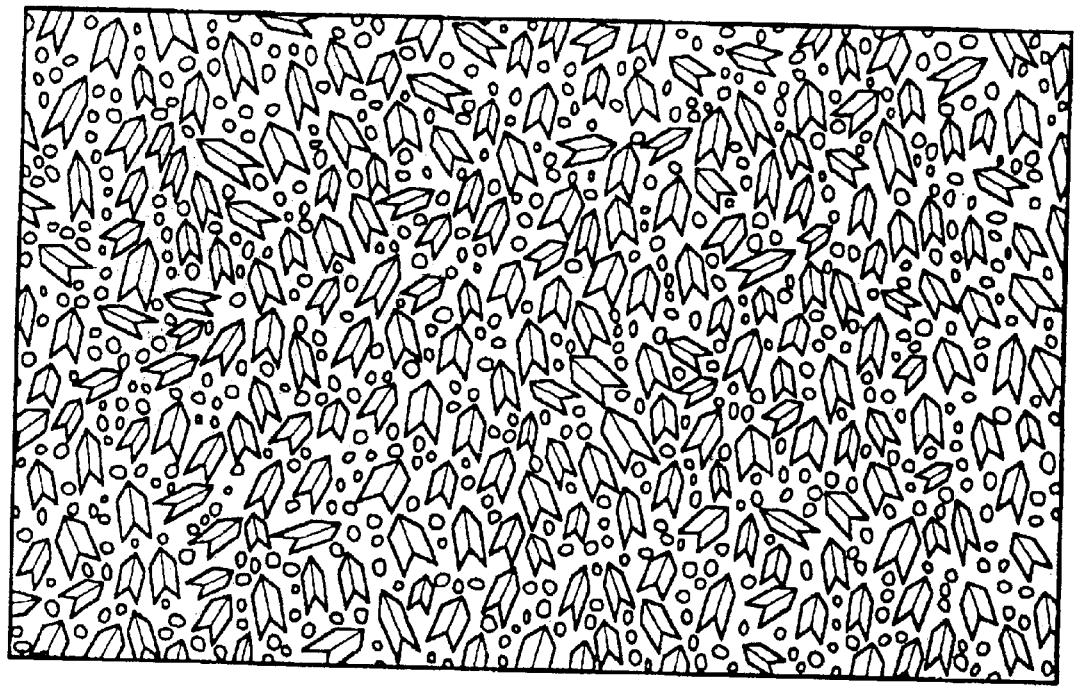
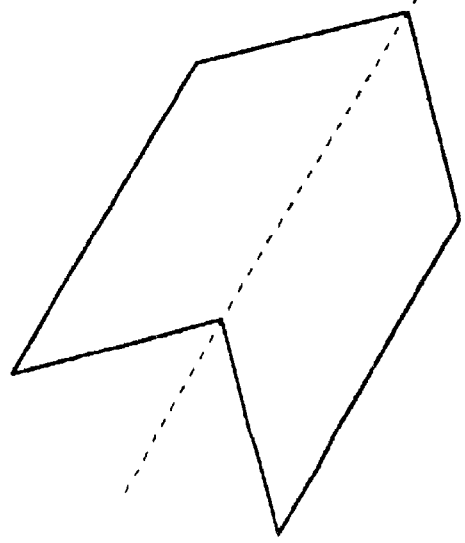
Twin-crystal face
(Mirror face)

FIG. 7

Chemically polished surface of electrodeposited copper foil containing twin crystals (20%)

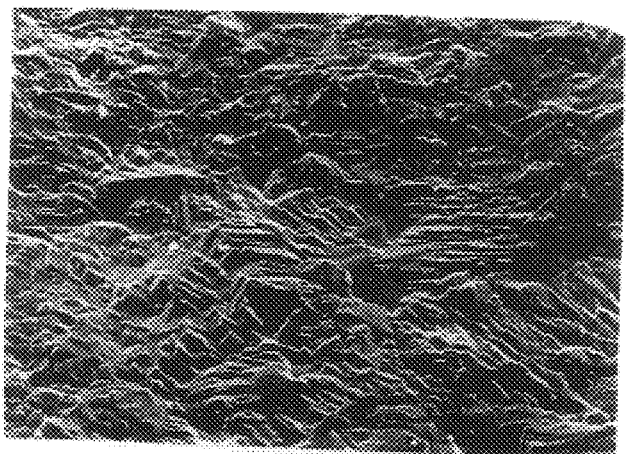

Chemically polished surface of electrodeposited copper foil containing twin crystals (10%)

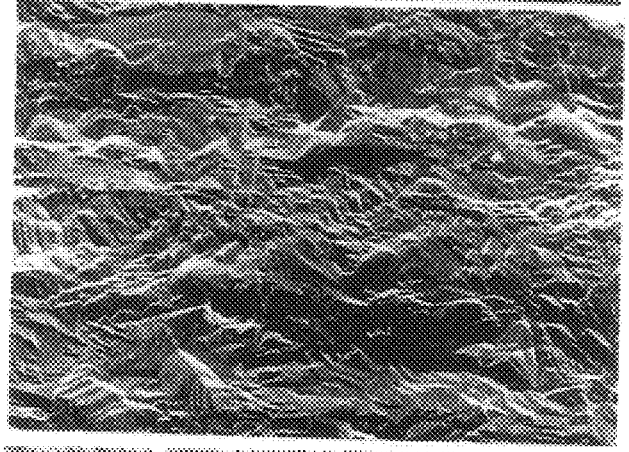

Chemically polished surface of electrodeposited copper foil containing no twin crystal

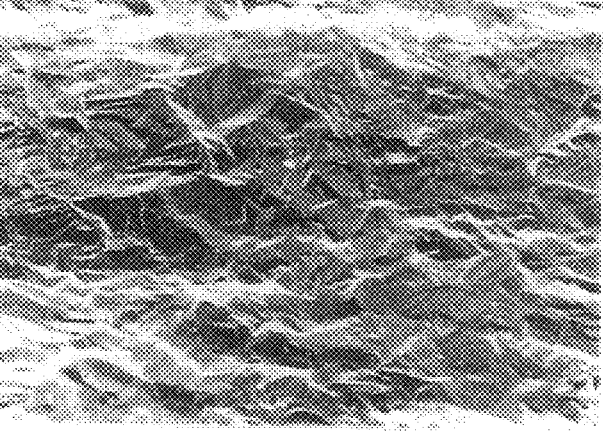

CHEMICAL POLISHING CONDITIONS
  Solution composition:
  First grade concentrated sulfuric acid 40 ml
  Aqueous hydrogen peroxide (30%) 32 ml
  Solution temperature: room temperature
  Polishing time        : 20 seconds Aspect ratio = 2h / |a - b|

Electroforming step A

ELECTRODEPOSITED COPPER FOIL

TECHNICAL FIELD

The present invention relates to electrodeposited copper foil; to a method of producing the electrodeposited copper foil; and to a copper-clad laminate produced from the electrodeposited copper foil.

BACKGROUND ART

Conventionally, copper foil has been employed as a material for producing printed wiring boards, which are widely used in the electric and electronics industries. In general, electrodeposited copper foil is bonded, through hot-pressing, onto an electrically insulating polymer material substrate such as glass-epoxy substrate, phenolic polymer substrate, or polyimide, to thereby form a copper-clad laminate, and the thus-prepared laminate is used for producing printed wiring boards.

In recent years, the thickness, weight, and dimensions of electronic and electric apparatus have been steadily decreasing, and therefore, there is corresponding demand for further downsizing of copper-clad laminates and printed wiring boards which are incorporated into such apparatus. In order to meet the demand, multi-layer technology has been employed to form high density circuits in printed wiring boards.

One important matter which has been pointed out is the application and pattern-formation of a etching resist, which is to be performed before etching to form circuits, so as to obtain fine printed wiring boards having a circuit pitch of 50 μm to 80 μm. Briefly, in order to achieve the required aspect ratio of the circuit formed by etching copper foil, a resist layer is appropriately formed without a problem before etching.

Several attempts involving etching process have been made to obtain printed wiring boards having a fine circuit pitch. Such attempts include (1) employment of resists such as a liquid resist and an electrodeposited resist instead of a dry film resist so as to reduce the thickness of the resist layer for sufficient supply of an etchant to the portions to be etched; (2) specifically roughening a copper foil surface through polishing such as physical polishing; e.g., buffing or micro etching so as to prevent dropping and adhesion-failure at the interface between the resist layer and the copper foil, thereby enhancing adhesion at the interface; and (3) selection of etching conditions such as the type of etchant in accordance with an etching machine, and the method of showering an etchant.

However, for copper foil to be etched during the production of printed wiring boards, only one countermeasure has been considered; i.e., further reducing the thickness of the copper foil to shorten the etching time and to avoid lowering the aspect ratio of the circuit obtained from the copper foil.

Particularly, adhesion between the copper foil and the resist material is a phenomenon manifested at the interface of an organic material and an inorganic material. Few studies have been conducted on the above phenomenon, particularly on the mechanism thereof, as compared with other technical fields. Thus, this form of adhesion has not yet been fully elucidated.

During production of printed wiring boards, an etching resist layer is formed on a copper foil; the layer is exposed so as to form a circuit(wiring) pattern; and the exposed layer is developed so as to remove the unneeded portions of the resist. However, when printed wiring boards having a circuit pitch of 50 μm to 80 μm are actually produced, some portions of the resist layer required to remain adhered onto the copper foil is sometimes unintentionally removed. For this reason, adhesion between the resist layer and the copper foil has been considered an important issue.

For example, even though the portion of the resist layer which has been dropped away is very narrow, the portion causes a continuity failure; i.e., an open circuit may be created during etching to form the circuit, thereby considerably reducing the production yield of printed wiring boards.

Even when the circuit obtained from a copper foil has no open circuit after etching, a decrease in the width of the circuit obtained during the etching process may cause problems. Briefly, when the thus-produced printed wiring boards are inspected and even no open circuit is found, there may still be a narrowing of the circuit at certain portions, resulting in increased electric resistance of the narrower portion. If such a printed wiring board is incorporated into an electric apparatus and operated, the high-resistance portion generates a lot of heat, thereby causing considerable deterioration of the copper circuits and rapid, unfavorable hardening of the wire. As a result, an open circuit may be induced by the wiring board being subjected to a low-intensity shock, possibly leading to a sudden breakdown of the electric apparatus.

BRIEF DESCRIPTION OF THE DRAWINGS

FIG. 3 shows the respective grain sizes titanium materials for comparison.

FIG. 4 shows a TEM image and an electron-beam diffraction image of an electrodeposited copper foil having no twin-crystal structure.

FIG. 5 shows a TEM image and an electron-beam diffraction image of an electrodeposited copper foil having a twin-crystal structure.

FIG. 6 is a schematic illustration of twin crystals present in a surface of an electrodeposited copper foil.

FIG. 7 shows images of surface of electrodeposited copper foils after micro etching.

DESCRIPTION OF THE INVENTION

In view of the foregoing, the present inventors conducted extensive studies on a copper foil which can enhance adhesion at the interface between the copper foil and a resist layer, and found that the below-described copper foil enhances adhesion between the foil and a resist layer without need of physical polishing such as buffing. The present invention has been accomplished on the basis of this finding.

In the present invention, there is provided an electrodeposited copper foil obtained by electrolyzing a solution containing a copper component, wherein 20% or more of the crystals present in a shiny side surface of the electrodeposited copper foil have a twin-crystal structure, the percentage being determined in terms of area.

Figure 1:
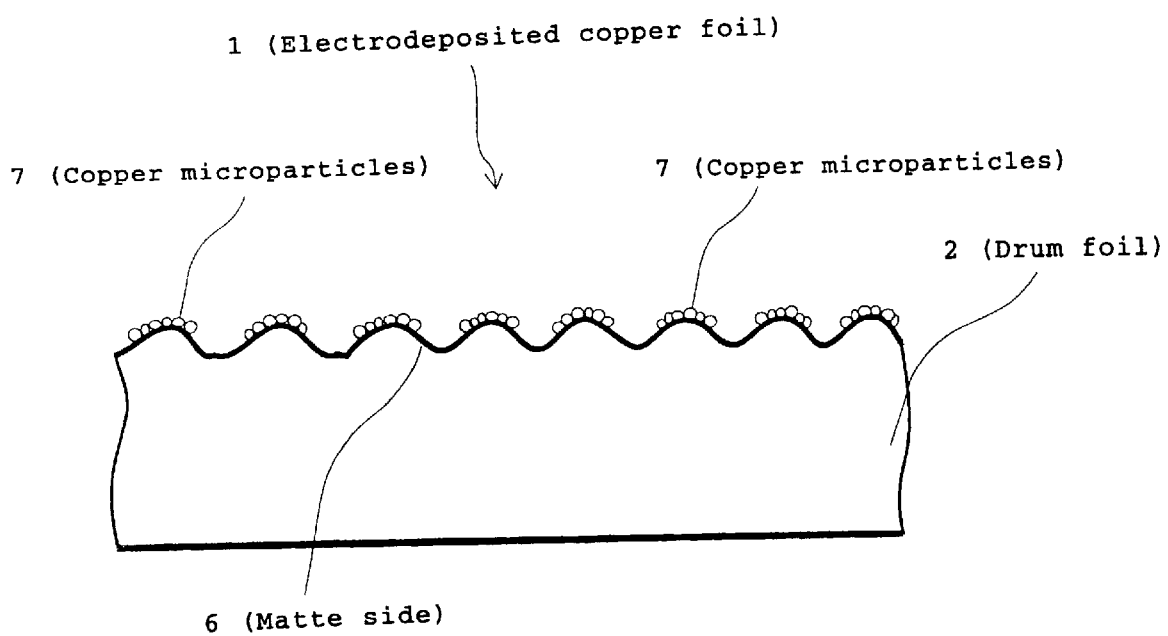
FIG. 1 is a schematic cross-sectional view of an electrodeposited copper foil.
Figure 2:
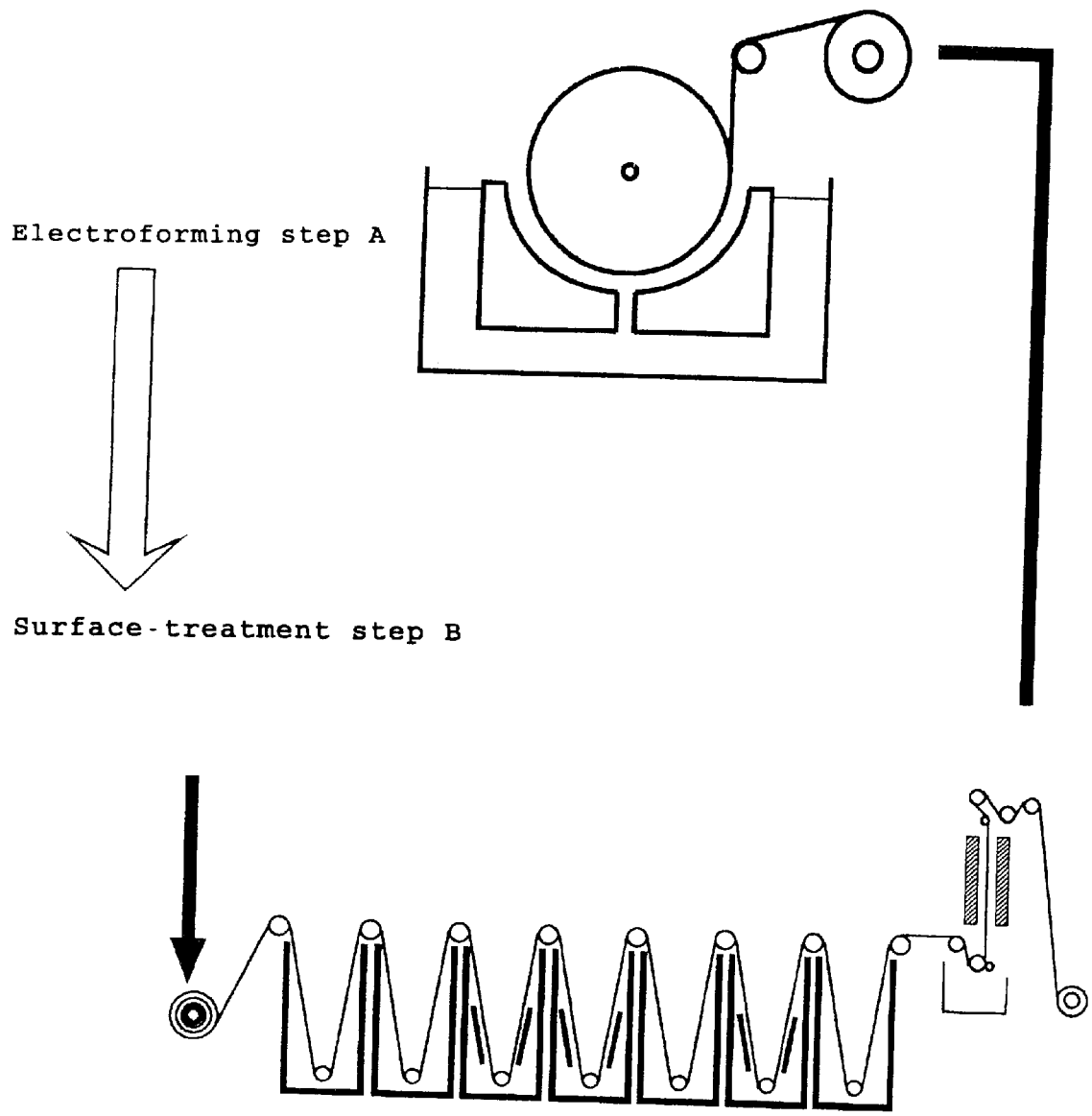
FIG. 2 is a schematic illustration showing the production steps for electrodeposited copper foil.

The steps for production of an electrodeposited copper foil through the applying and patterning of a resist according to the present invention will now be described. For the sake of simplicity, the invention is described with reference to FIGS. 1 to 3. Typically, the electrodeposited copper foil having a cross-sectional structure shown in FIG. 1 is produced through an electroforming step and a surface-treatment step shown in FIG. 2 and is employed as a material for producing printed wiring boards, which are predominantly used in the electric and electronics industries. In FIG. 1, an anti-corrosion layer formed in the surface-treatment step is not shown.

The apparatus employed in the electroforming step; more correctly, the apparatus for producing a bulk copper foil layer, comprises a rotating drum cathode and an insoluble anode which faces the cathode so as to surround the drum cathode. In the apparatus, a copper sulfate solution is fed into a space defined by a rotating drum cathode and an insoluble anode, and copper is deposited on the surface of the rotating drum cathode through electrolysis. The deposited copper forms a copper foil by continuous peeling from the rotating drum cathode. The thus-obtained copper foil is hereinafter referred to as a "drum foil," and the expression "forming a bulk copper layer" will sometimes be used. Since the drum foil has not been subjected to any surface treatment such as anti-corrosion treatment, the foil having a highly activated surface readily undergoes oxidation by oxygen contained in the air.

The drum foil surface which is peeled from the rotating drum cathode is shiny and smooth, since the mirror-polished surface of the rotating cathode is transferred to the foil surface. The thus-obtained surface is called the shiny side. In contrast, the surface configuration of the other surface, on which copper is electrodeposited, is rough, since the growth rate of copper varies depending on the deposited crystal plane. Thus, this surface is called the matte side. The matte side serves as a surface onto which an insulating material is bonded during production of a copper-clad laminate. Throughout the present description, the term "matte side" is employed for describing a rough surface of the drum foil.

In the present invention, a twin-crystal structure is provided, during electrolysis, in the shiny side surface of the copper foil, such that 20% or more of the crystals present in a shiny side surface of the copper foil have a twin-crystal structure, the percentage being determined in terms of area. The twin-crystal structure content is preferably maintained in the surface, but the term "surface" also covers a shiny side surface layer to a depth of 5 μm or more. The depth must be considered, because the surface layer of the drum foil is removed in a thickness of approximately 1–2 μm during micro etching process carried out before formation of the below-described etching resist layer to remove a corrosion-inhibiting element and to provide rough surface.

In the present invention, the percentage of the twin-crystal structure is determined by observing the shiny side surface under a TEM (transmission electron microscope) and obtaining a ratio of the area which comprises obviously recognized twin crystals to the area of the observed TEM image. In order to clearly identify a boundary between a portion of twin-crystal structure and other crystal grains, a small area of 15 μm×15 μm is observed under a TEM at a magnification of 10,000 or more. Those portions assuming ridge-like patterns are considered to be areas which comprise obviously recognized twin crystals. In the present invention, "20% or more" of the crystals present in the observed surface have a twin-crystal structure. The percentage determined through the above method is not considered to be an absolute value, but includes a certain range of measurement error. The present inventors have confirmed through studies that an error of approximately 10% is included in the observed percentage.

In order to produce an electrodeposited copper foil according to the present invention in which 20% or more of the crystals present in a shiny side surface of the electrodeposited copper foil have a twin-crystal structure, the conditions employed for producing a drum foil are important factors. Accordingly, there is provided a method of producing an electrodeposited copper foil including electroforming and surface treatment, wherein the electroforming includes feeding a copper sulfate solution into a space defined by a rotating drum cathode and an insoluble anode which faces the cathode so as to surround the drum cathode, to thereby perform continuous electroforming; peeling the copper foil electrodeposited on the rotating drum cathode; and employing a titanium material having a grain size number of 6.0 or more as a copper deposition surface of the rotating drum cathode.

That is, the grain size number of the titanium material constituting a copper deposition surface of the rotating drum cathode must be controlled to 6 or more. In the present invention, "a grain size number of 6.0 or more" is determined by using photographs of crystal grains of titanium materials as shown in FIG. 3. The crystal grain size of a sample is determined through a method of section. The measurement is performed on the basis of standards similar to those defined by JIS G 0552, "Test method to determine the grain size of ferrite in steel." Specifically, the observed photographic image is enlarged to a magnification of 100, thereby confirming the presence of crystal grains, and the average number of grains on an area of 25 mm×25 mm is obtained to determine the grain size number, which is derived from the following formula:

$$\text{Grain size No.} = (\log n/0.301) + 1 \qquad \text{Formula 1}$$

n: the number of crystal grains within an area of 25 mm×25 mm in a microscopic image which is enlarged to a magnification of 100.

Thus, the finer the crystal grains in a titanium material, the higher the twin-crystal structure percentage in a shiny side surface, to a depth of approximately 5.0 μm, of an electrodeposited copper foil produced by using a cathode drum having a titanium material surface. When "a grain size number of 6.0 or more of titanium material" according to the present invention is not satisfied, the condition that 20% or more of the twin-crystals present in a shiny side surface of the copper foil cannot be attained.

In the present invention, there is provided a method of producing an electrodeposited copper foil, wherein glue and/or gelatin is added in an amount of 0.2–20 mg/l to the copper sulfate solution.

Commercially available glue and gelatin; e.g., edible gelatin, can be employed. In general, glue and gelatin are known as additives which arrange the physical properties of electrodeposited copper foil such as elongation and deflection resistance. Glue and gelatin may be employed in combination. In the present invention, glue and gelatin are employed to serve as a microquantity-chlorine-component source to an electrolyte as well as to obtain the conventionally known effect of improving physical properties, since glue and gelatin generally contain, more or less, a chlorine component in an amount of approximately 5000 μg/g to 20,000 μg/g. In the present invention, when a drum foil is produced from an electrolyte containing a microquantity of a chlorine component and by use of a rotating drum cathode having a surface formed of a titanium material having a grain size number of 6.0 or more, a twin-crystal structure can be effectively formed. In other words, a microamount of a chlorine component serves as a twin-crystal-formation accelerator.

When the amount of glue and/or gelatin is less than 0.2 mg/l in production of an electrodeposited copper foil according to the present invention, the effect of accelerating the formation of twin-crystals is not attained, whereas when the amount exceeds 20 mg/l, the effect of accelerating the formation of twin-crystals does not increase commensurate with the additional amount, and the percentage of twin crystals does not increase.

An electrodeposited copper foil produced without satisfying the aforementioned conditions contains no twin crystals. Even though the copper foil contains twin crystals in a surface, the percentage thereof is less than 20%, and the twin crystals are distributed within a depth of 2 μm. FIG. 4 shows a TEM (transmission electron microscopic) image and an electron-beam diffraction image of a drum foil produced without satisfying the aforementioned conditions, and FIG. 5 shows a TEM (transmission electron microscopic) image and an electron-beam diffraction image of a drum foil having a twin-crystal structure and produced under the aforementioned conditions. As is clear from the electron-beam diffraction image of FIG. 5, the presence of a specific twin face is confirmed. In contrast, no twin crystal can be identified in FIG. 4, the image being observed at a magnification of 3000. When the same image is enlarged to a magnification of 10,000 or more, no twin crystal can be confirmed. FIG. 5 shows an image observed at a magnification of 11,000, where a twin-crystal structure can be positively confirmed. In the TEM image of FIG. 5, the twin crystal portions can be seen as stripe in the dark portions.

In the present specification, the term "twin crystal" or "twin-crystal structure" refers to copper crystal grains which constitute an electrodeposited copper foil, in which the crystal planes of deposited crystals are mirror-symmetric with one another with respect to a specific crystal plane. Thus, a schematic image of the possible distribution of a twin-crystal structure present in a surface of the electrodeposited copper foil is represented by the image as shown in FIG. 6.

After drum foil production is complete, the foil is subjected to surface treatment including nodular treatment on the matte side and anti-corrosion treatment on both sides. The matte side is subjected to nodular treatment; i.e., the drum foil is subjected to electroplating in a copper sulfate solution using a current under burnt plating conditions, to thereby form copper microparticles on the matte side such that the matte side surface becomes rough. Immediately after the deposition, the foil is subjected to seal plating by use of a current under level plating conditions, to thereby prevent release of deposited copper microparticles. Thus, the matte side onto which copper microparticles are deposited is called the "nodular-treated side."

Subsequently, the nodular-treated foil is subjected to anti-corrosion treatment in which both sides of the copper foil are treated with plating such as zinc, a zinc alloy, a chromium-containing plate, and/or a chromate. The thus-treated foil is dried and wound up in a roll, to produce an electrodeposited copper as a final product. The thus-treated foil is generally called a "surface-treated foil."

Although a schematic cross-sectional view of an electrodeposited copper foil is shown in FIG. 1, illustrations of a seal-plating layer and an anti-corrosion layer are not shown. This is because these layers are generally too thin to illustrate. The anti-corrosion layer is provided to prevent oxidation of the copper foil caused by contact with air, and therefore, the anti-corrosion layers constitute the outermost surfaces of the copper foil after nodular treatment is completed. In other words, the outermost layers of the shiny side surface and the matte side surface of the electrodeposited copper foil are anti-corrosion layers.

The thus-produced electrodeposited copper foil (surface-treated foil) is laminated with a prepreg forming an insulating layer, and laminated by hot-pressing, thereby preparing a variety of copper-clad laminates. Printed wiring boards are produced by etching such copper-clad laminates.

Etching performed in the present invention will next be described by taking a simple etching process as an example. The first step is pre-treatment of an electrodeposited copper foil which forms a surface of a copper-clad laminate. Typically, the pre-treatment comprises the following two steps: (1) micro etching in which a surface of the electrodeposited copper foil is chemically dissolved to a depth of approximately 2 μm so as to remove stains, unnecessary oxide layer, and a corrosion-inhibiting element; and (2) physical polishing such as buffing in which a surface of the electrodeposited copper foil is removed to a depth of approximately 2 μm so as to clean the surface and impart appropriate roughness to the surface so as to enhance adhesion to an etching resist to be formed thereon.

Conventional electrodeposited copper foil, in which no twin crystal structure is found in copper microcrystalline grains that constitute a shiny side surface of the copper foil, or less than 20% of the crystals are present in a shiny side surface of the copper foil have a twin-crystal structure, may not provide excellent adhesion to an etching resist for forming a fine circuit having a pitch of 130 μm or less, unless the foil is subjected to micro etching and physical polishing in combination.

In contrast, the aforementioned stage of physical polishing can be omitted for the electrodeposited copper foil according to the present invention, in which 20% or more of the crystals present in a shiny side surface of the copper foil have a twin-crystal structure. When the electrodeposited copper foil according to the present invention is subjected to only micro etching, excellent adhesion to an etching resist is assured. Micro etching per se cannot be omitted, since a corrosion-inhibiting element is removed through micro etching.

After completing of pre-treatment, an etching resist layer is formed on a surface of the electrodeposited copper foil. The etching resist layer is typically formed of a dry film resist, an electrodeposited resist, or a liquid resist. A pattern film is placed on the etching resist layer so as to effect patternwise exposure. Next, the exposed resist layer is developed. The development is typically performed by immersing a patternwise-exposed etching resist layer in an alkaline solution for a predetermined time. When adhesion between an electrodeposited copper foil and an etching resist layer is considerably poor, some of the etching resist which should remain adhering to the copper foil is dropped away from the copper foil. Even though the resist is not dropped completely from the copper foil, a portion of the resist is detached from the copper foil, thereby impairing the function of the etching resist. In this case, a portion of the electrodeposited copper foil under the etching resist may be dissolved, resulting in an open circuit.

Adhesion to an etching resist was evaluated for copper-clad laminates employing the electrodeposited copper foil according to the present invention, in which 20% or more of the crystals present in a shiny side surface of the copper foil have a twin-crystal structure, and copper-clad laminates employing an electrodeposited copper contain no twin crystal. The results are shown in Table 1. The pre-treatment did not include physical polishing, but included micro etching performed by using a sulfuric acid-hydrogen peroxide etchant (first grade concentrated sulfuric acid 40 ml/l, 30% hydrogen peroxide 32 ml/l). After the pre-treatment had been completed, the samples were rinsed and dried. A UV-curable dry film (product of Nichigo Alfo) serving as an etching resist was laminated on each electrodeposited copper foil, and a pattern film for forming a comb-like circuit (circuit width 30 $\mu$m, inter-line gap 100 $\mu$m, and pitch 130 $\mu$m) was placed on the etching resist. The etching resist was patterned through exposure and development, to thereby form a target pattern. Drop of the patterned resist after formation was observed under a microscope (×25). In addition, the patterned resist was subjected to a peel test using a TESA tape. The dropped status was observed in a similar manner.

TABLE 1

| Samples (Cu-clad laminates) | Dry film adhesion test results | |
| --- | --- | --- |
| | Test 1* | Test 2** |
| Electrodeposited Cu foil (twin-crystal structure 20%) | 0/30 | 0/30 |
| Electrodeposited Cu foil (twin-crystal structure 10%) | 12/30 | 18/30 |
| Electrodeposited Cu foil (no twin-crystal structure) | 21/30 | 28/30 |

*Test 1: Thirty specimens were observed under a microscope (×25). Each value of Test 1 is the number of specimens in which peeling or detachment of dry film at an edge portion was identified.
** Test 2: TESA tape of 20-mm-width was affixed to the comb-like-patterned dry film. The tape was pulled in a lengthwise direction of the tape. Each value of Test 2 is the number of specimens which exhibited transfer of the dry film to the adhesive side of the tape. Thirty specimens were observed.

As is clear from Table 1, 30 specimens of copper-clad laminates employing electrodeposited copper foil, in which 20% of the crystals present in a shiny side surface of the copper foil have a twin-crystal structure, exhibited no detachment of dry film from the foil in Test 1 and no transfer of dry film to the tape in Test 2. Thus, the electrodeposited copper foil according to the present invention has been proven to exhibit excellent adhesion to a dry film. In contrast, the above Tests also clearly show that copper-clad laminates employing an electrodeposited copper containing no twin crystal exhibits the worst adhesion to a dry film.

The variation in adhesion is thought to be induced by differences between the profile of fine surface roughness displayed by a copper foil containing twin crystals and that of a copper foil containing no twin crystal, the roughness being imparted by micro etching. FIG. 7 shows profiles of surface roughness of electrodeposited copper foils after micro etching. Samples observed under an SEM (scanning electron microscope) are a copper-clad laminate employing an electrodeposited copper foil, in which 20% of the crystals present in a shiny side surface of the copper foil have a twin-crystal structure; a copper-clad laminate employing an electrodeposited copper foil, in which 10% of the crystals present in a shiny side surface of the copper foil have a twin-crystal structure; and a copper-clad laminate employing an electrodeposited copper foil containing no twin crystal. As is clear from FIG. 7, the greater the amount of twin crystals present in a surface of an electrodeposited copper foil, the greater the number of roughened portions which can be identified after micro etching in the surface profile. Thus, an electrodeposited copper foil according to the present invention, in which 20% or more of the crystals present in a shiny side surface of the copper foil have a twin-crystal structure, is considered to assure excellent adhesion to an etching resist, without performing physical etching, due to extensive generation of micro-roughness after micro etching.

Figure 8:
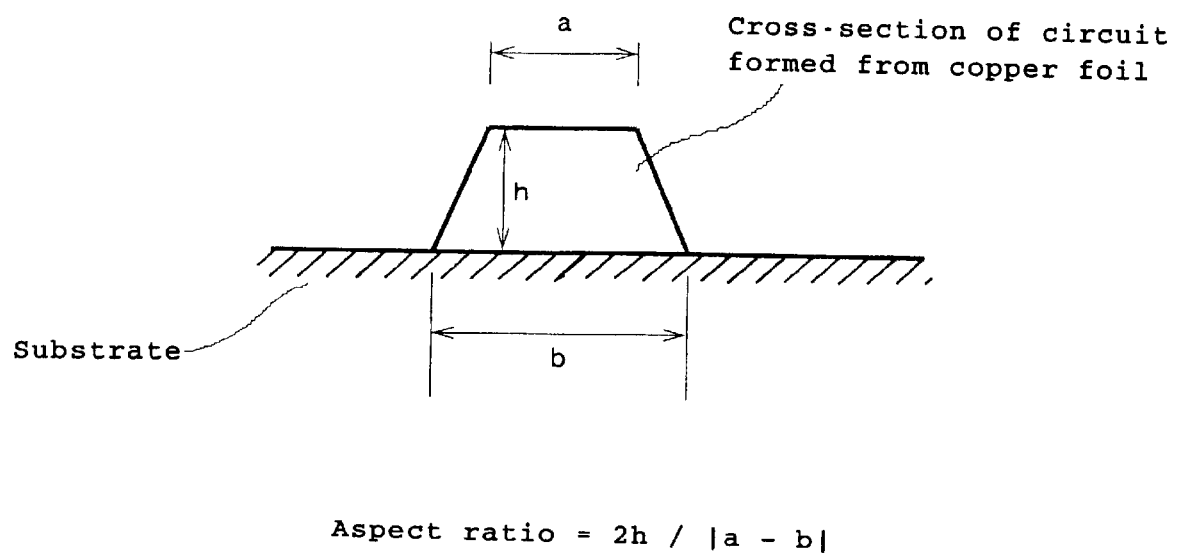
FIG. 8 is a schematic cross-sectional view of a circuit produced from a copper foil.

Typically, in the production process for printed wiring boards, after an etching resist layer is patterned, the copper foil is etched, to thereby remove unnecessary portions of the copper foil so as to form a printed wiring board. In a sense, the difference in circuit width between the target width and the actually obtained width serves an index of adhesion between an etching resist layer and an electrodeposited copper foil layer. FIG. 8 is an enlarged schematic cross-sectional view of a wiring obtained from a copper foil through etching. The width of the wiring is defined as the width of an upper portion ("a" in FIG. 8) and that of a lower portion ("b" in FIG. 8) which contacts the substrate. Preferably, the widths "a" and "b" coincide and fall within the target width. Briefly, the higher the aspect ratio, the better the etchability.

However, in the present invention, evaluation of adhesion between an etching resist layer and an electrodeposited copper foil layer—a key point of the invention—on the basis of the aspect ratio is not preferred, since the aspect ratio is generally an index for evaluating etchability from a variety of points of view, such as the composition of an etchant and the method by which the etchant is supplied. Thus, the width of the formed etching resist circuit pattern and the upper portion width ("a" in FIG. 8) of the copper wiring formed through etching are compared, and the difference employed to evaluate adhesion, The results are shown in Table 2. In an attempt to obtain a wiring width of 30 $\mu$m, the etching resist layers of all samples were developed simultaneously. For all samples, the measured width of the etching resist wiring pattern was found to be 29.3 $\mu$m. All the employed electrodeposited copper foils had a nominal thickness of 18 $\mu$m.

TABLE 2

| Samples (Cu-clad laminates) | Measured width of etching resist circuit pattern ($\mu$m) | Measured width of upper portion of copper circuit produced through etching ($\mu$m) |
| --- | --- | --- |
| Electrodeposited Cu foil (twin-crystal structure 20%) | 29.3 | 28.4 |
| Electrodeposited Cu foil (twin-crystal structure 10%) | | 23.7 |
| Electrodeposited Cu foil (no twin-crystal structure) | | 20.8 |

Etching of copper foil: Etchant, copper sulfate solution
Measurement: By use of an optical measuring apparatus.

As is clear from Table 2, copper-clad laminates employing an electrodeposited copper foil, in which 20% of the crystals present in a shiny side surface of the copper foil have a twin-crystal structure, exhibit a smaller difference between the measured etching resist wiring pattern and the measured width of the upper portion of the copper wiring produced through etching. The reason for the small difference is considered to be that the excellent adhesion between the etching resist and the surface of the electrodeposited copper foil suppresses invasion of the etchant into a portion of the copper foil under the etching resist, so that the copper foil is not etched excessively.

Similar to results of the dry film adhesion test shown in Table 1, copper-clad laminates employing an electrodeposited copper containing no twin crystal exhibit the largest difference between the measured etching resist wiring pattern and the measured width of the upper portion of the copper wiring produced through etching. This indicates that adhesion between the etching resist and the surface of the electrodeposited copper foil is poor. The width of the lower portion of the comb-like wiring produced by use of each copper-clad laminate was 31–31.5 µm, showing a uniform level of copper foil etching.

The present invention attains an etching precision which attains a wiring width approximately equal to the target value; therefore, the copper foil of the present invention is advantageous for circuit design. Specifically, the invention can eliminate, in circuit design, estimation of a dimensional error generated during etching; provision of a planned mounting area in a land portion during mounting of a variety of devices; and enhancing connection reliability during mounting of the devices.

The invention includes a copper-clad laminate employing an electrodeposited copper foil, in which 20% of the crystals present in a shiny side surface of the copper foil have a twin-crystal structure. The copper-clad laminate can eliminate physical polishing included in etching pre-treatment, thus reducing the number of production steps and therefore reducing production costs. In addition, since adhesion between the etching resist and the electrodeposited copper foil is enhanced, electric circuits of fine pitch can be easily produced, greatly enhancing the production yield of printed wiring boards.

MODES FOR CARRYING OUT THE INVENTION

Figure 9:
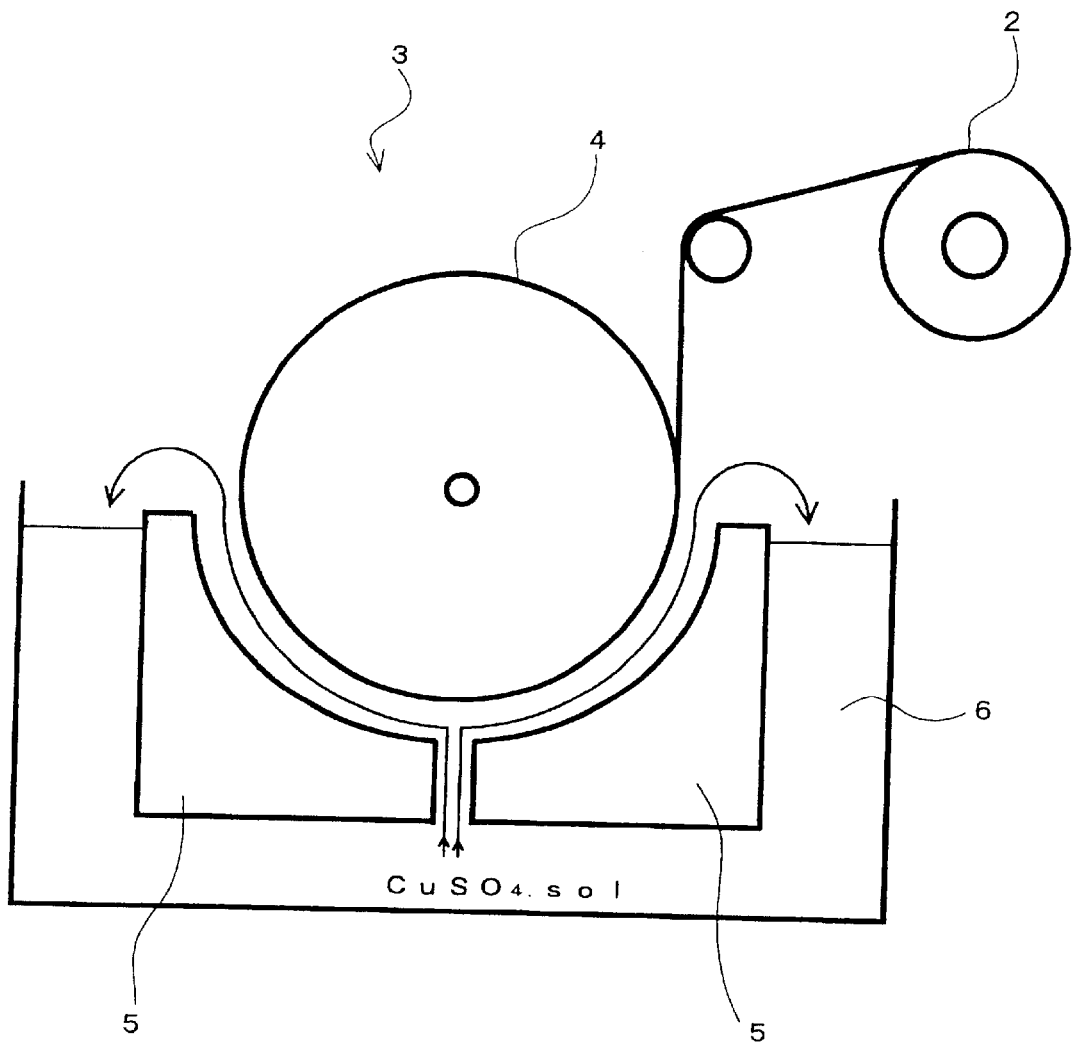
FIG. 9 is a schematic cross-sectional side view of an electroforming apparatus.

The method of producing an electrodeposited copper foil according to the present invention will be described with reference to FIGS. 1, 9, and 10. In addition, a copper-clad laminate was produced from an electrodeposited copper foil produced through the method, and the adhesion of the copper foil was evaluated in the aforementioned manner.

In general, an electrodeposited copper foil is produced through an electroforming step A and a surface-treatment step B. An electrodeposited copper foil 1 according to the present invention is also produced in the same manner.

Firstly, the electroforming step A is described. In the electroforming step A, a drum foil (bulk copper layer) 2 of the electrodeposited copper foil 1 is produced. The drum foil serves as an electrical conductor after it has been processed into a printed wiring board. An electroforming apparatus 3 comprises a rotating drum cathode 4 and a lead anode 5 which faces the cathode 4 so as to surround the drum cathode. In practice, a copper sulfate solution is fed into a space defined by the rotating drum cathode and the lead anode, to thereby perform electroforming, and copper is deposited on the drum surface of the rotating drum cathode 4. The thus-deposited copper forms a copper foil by continuously peeling it from the rotating drum cathode 4 and rolling it up. The surface of the rotating drum cathode onto which copper is deposited is made of a titanium sheet having a grain size number of 7.1.

An acidic solution of copper sulfate comprising copper sulfate ($CuSO_4 \cdot 5H_2O$) (280–360 g/l), sulfuric acid (100–150 g/l), and glue (0.2–20 mg/l) is employed as an electrolyte for the electroforming step A. Electrolysis is continuously carried out at a solution temperature of approximately 50° C. and at a current density of 50–100 A/dm$^2$, while deposited copper is rolled up, to thereby produce a roll of the drum foil 2. More specifically, a solution comprising copper sulfate ($CuSO_4 \cdot 5H_2O$) (360 g/l), sulfuric acid (150 g/l), and glue (3 mg/l) is electrolyzed at a solution temperature of 49° C. and at a current density of 100 A/dm$^2$, thereby producing the drum foil 2 for producing the electrodeposited copper foil 1 having a nominal thickness of 18 µm. Since the drum foil 2 has not been subjected to any surface treatment such as anti-corrosion treatment, the copper immediately after undergoing electrodeposition has a highly activated surface which readily undergoes oxidation by oxygen contained in the air.

After the drum foil 2 is produced, the foil is subjected to surface treatment, in the surface-treatment step B, including nodular treatment and anti-corrosion treatment of a matte side 6. The matte side 6 is subjected to nodular treatment; i.e., the drum foil is subjected to electrolysis in a copper sulfate solution with a current under burnt plating conditions, to thereby form copper microparticles 7 on the matte side 6. Immediately after the deposition, the foil is subjected to seal plating with a current under level plating conditions, to thereby prevent release of deposited copper microparticles. Thus, the matte side 6 onto which copper microparticles 7 were deposited is hereinafter referred to as a "nodular-treated side 8."

Subsequently, in the surface-treatment step B, the nodular-treated foil is subjected to anti-corrosion treatment in which both sides of the drum foil 2 are treated with plating such as zinc, a zinc alloy, or a chromium-containing layer. The thus-treated foil is dried and rolled, to thereby produce an electrodeposited copper according to the present invention. The surface treatment will next be described in more detail.

Figure 10:
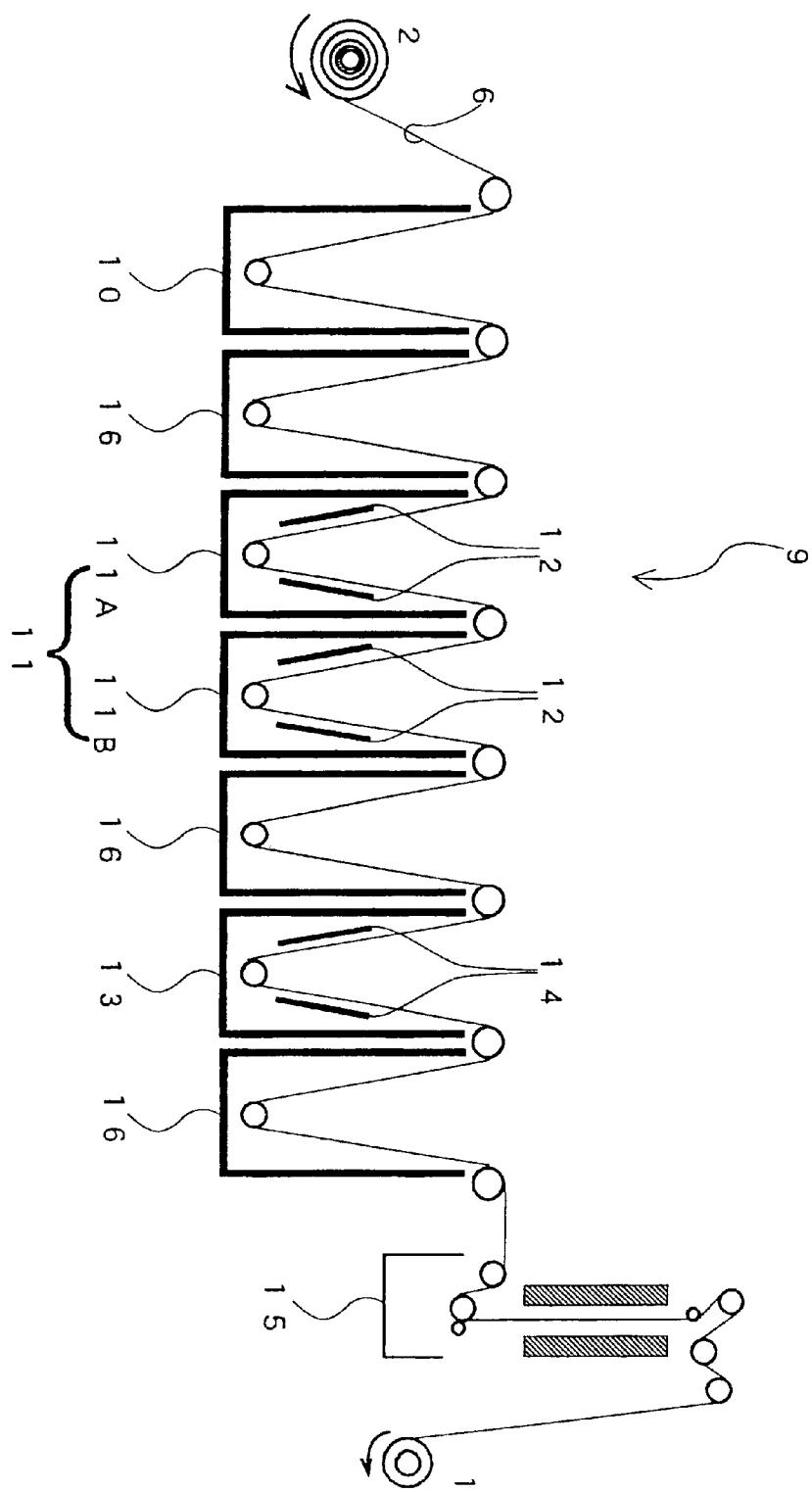
FIG. 10 is a schematic cross-sectional side view of a surface-treating apparatus.

In the surface-treatment step B, the drum foil 2 is unwound from a foil roll and traveled, in a winding manner, in the surface-treatment apparatus 9 as shown in FIG. 10, which is a schematic cross-sectional view. Hereinafter, production conditions will be described with reference to the apparatus 9 wherein a variety of baths are continuously disposed in-line.

Firstly, the drum foil 2 taken from the foil roll is introduced into a pickling bath 10 filled with a diluted sulfuric acid solution having a concentration of 150 g/l at a solution temperature of 30° C. The foil is immersed for 30 seconds, to remove oily matter and excessive surface oxide layer from the surface of the drum foil 2.

After the drum foil 2 has been treated in the pickling bath 10, the foil is transferred into nodular-treatment baths 11 in order to form copper microparticles 7 on the matte side of the drum foil 2. The treatment carried out in the nodular-treatment baths 11 involves depositing copper microparticles 7 on the matte side of the drum foil 2 (in bath 11A) and seal-plating so as to prevent release of the copper microparticles 7 (in bath 11B).

In the bath 11A for depositing copper microparticles 7 on the drum foil 2, a copper sulfate solution (sulfuric acid concentration of 100 g/l, copper concentration of 18 g/l, temperature 25° C.) is employed, and electroplating is carried out for 10 seconds under conditions for forming burnt plating at a current density of 10 A/dm$^2$ thereby depositing copper microparticles 7. In this case, as shown in FIG. 10, anode plates 12 are placed in parallel the surface of the foil, onto which copper microparticles 7 are formed, of the drum foil 2.

In the seal-plating bath 11B for preventing release of the copper microparticles 7, a copper sulfate solution (sulfuric acid concentration of 150 g/l, copper concentration of 65 g/l, temperature 45° C.) is employed, and electroplating is carried out for 20 seconds under level plating conditions and at a current density of 15 A/dm$^2$. In this case, as shown in FIG. 10, anode plates 12 are placed to face the copper-microparticles (7)-deposited surface of the drum foil 2 in parallel.

Anti-corrosion treatment is carried out in an anti-corrosion-treatment bath 13, by use of zinc as a corrosion-inhibiting element. The zinc concentration in the anti-corrosion-treatment bath 13 is maintained by employing a soluble anode 14 formed of a zinc plate. The electroplating is carried out in a zinc sulfate solution comprising sulfuric acid (70 g/l) and zinc (20 g/l), at a temperature of 40° C. for 10 seconds and a current density of 15 A/dm$^2$.

After completion of the anti-corrosion treatment, the drum foil 2 is passed through, over 40 seconds, a drying portion 15 where the atmosphere had been adjusted by means of an electric heater to 110° C. The thus-dried surface-treated copper foil is then wound into a roll, to thereby produce the electrodeposited copper foil 1 having a foil thickness of 18 μm. During the aforementioned steps, the drum foil runs at 2.0 m/minute in the surface-treatment apparatus 9. A rinsing bath 16 capable of performing about 15 sec. water-rinsing is disposed between successive operation baths, thereby preventing the solution from being carried over from the previous bath.

The thus-produced electrodeposited copper foils 1 and a sheet of FR-4 prepreg having a thickness of 100 μm are laminated such that the matte side 6 of each electrodeposited copper foil adheres to the prepreg, to thereby produce double-sided copper-clad laminate samples (50 mm×50 mm). Evaluation of the samples was carried out in a manner similar to that described in Tables 1 and 2. In a dry film adhesion test, samples were selected from different sites within a single lot. Each of the aforementioned Tests 1 and 2 was carried out for 20 samples. The results reveal that no edge portion of the circuit produced by developing the dry film had become detached and no transfer of dry film to a test tape was observed. The copper-clad laminated sample was further etched so as to produce a 130-μm-pitch comb-like circuit as described above. The produced copper circuit has an average width of 29.1 μm, which closely approximates the target circuit width of 30 μm.

EFFECTS OF THE INVENTION

By employing the copper-clad laminate produced from an electrodeposited copper foil according to the present invention, an etching precision attaining a wiring width approximately equal to the target width can be attained and circuit design for fine pattern printed wiring boards can be simplified. In addition, more reliable connections can be made between devices and wiring during mounting of the devices. In terms of production process, the copper-clad laminate need no physical polishing during etching pretreatment, reducing the number of steps in the production process and thereby reducing production costs also. In addition, since adhesion between the etching resist and the electrodeposited copper foil is enhanced, electric circuits of fine pitch can be easily produced, greatly enhancing the production yield of printed wiring boards.

What is claimed is:

1. An electrodeposited copper foil, wherein 20% or more of the crystals present in the shiny side surface of the electrodeposited copper foil have a twin-crystal structure, the percentage being determined in terms of area.

2. A method of producing an electrodeposited copper foil as recited in claim 1 by electrolysis of a copper sulfate solution so as to form a foil, wherein said electrolysis includes feeding said copper sulfate solution to a space defined by a rotating drum cathode and an insoluble anode which faces the cathode so as to surround the drum cathode, to thereby continuously electrodeposit copper on said drum cathode;

peeling the copper foil electrodeposited on the rotating drum cathode; and employing a titanium material having a grain size number of 6.0 or more as a copper deposition surface of the rotating drum cathode.

3. A method of producing an electrodeposited copper foil according to claim 2, wherein glue and/or gelatin is added in an amount of 0.2–20 mg/l to the copper sulfate solution.

4. A method of claim 3, wherein said glue contains about 5,000–20,000 ug/g of chloride.

5. A copper-clad laminate comprising said electrodeposited copper foil as recited in claim 1 laminated to a polymer substrate.

6. An electrodeposited copper foil of claim 1, wherein said shiny surface includes a depth of 5 μm.

7. A method of improving adhesion of a resist on the shiny surface of a copper foil comprising using as said copper foil said copper foil of claim 1 and microetching the surface of said foil before the resist is applied.

8. In a method of producing an electrodeposited copper foil wherein a copper sulfate solution is circulated between a rotating cathode drum and an insoluble anode, the improvement comprising producing a copper foil with 20% or more of the crystals in the shiny side of said foil having a twin crystal structure wherein said cathode drum has a titanium surface with a grain size number of 6.0 or more and said copper sulfate solution includes 0.2–20 mg/l of glue and/or gelatin.

9. A method of improving precision of the etching of wiring patterns in an electrodeposited copper foil comprising etching an electrodeposited copper foil having 20% or more of twin crystals in the shiny side surface of said foil to form wiring patterns.

\* \* \* \* \*